(12) United States Patent
Robert et al.

(10) Patent No.: US 7,179,392 B2
(45) Date of Patent: Feb. 20, 2007

(54) METHOD FOR FORMING A TUNABLE PIEZOELECTRIC MICRORESONATOR

(75) Inventors: Philippe Robert, Grenoble (FR); Grégory Caruyer, Goncelin (FR); Pascal Ancey, Revel (FR); Guillaume Bouche, Grenoble (FR)

(73) Assignees: STMicroelectronics S.A., Montrouge (FR); Commissariat a l'Energie Atomique, Paris Cedex (FR)

( * ) Notice: Subject to any disclaimer, the term of this patent is extended or adjusted under 35 U.S.C. 154(b) by 201 days.

(21) Appl. No.: 10/794,527

(22) Filed: Mar. 5, 2004

(65) Prior Publication Data

US 2004/0174091 A1    Sep. 9, 2004

(30) Foreign Application Priority Data

Mar. 6, 2003    (FR) .................................. 03 02817

(51) Int. Cl.
*H01L 41/08* (2006.01)
(52) U.S. Cl. .................. 216/2; 310/320; 29/25.35; 204/192.18
(58) Field of Classification Search .............. 29/25.35; 204/192.18
See application file for complete search history.

(56) References Cited

U.S. PATENT DOCUMENTS

| 5,587,620 | A | 12/1996 | Ruby et al. |
| 5,714,917 | A | 2/1998 | Ella |
| 5,884,378 | A | 3/1999 | Dydyk |
| 6,204,737 | B1 | 3/2001 | Ella |
| 6,242,843 | B1 | 6/2001 | Pohjonen et al. |
| 6,507,983 | B1* | 1/2003 | Ruby et al. ................ 29/25.35 |
| 2005/0162040 | A1* | 7/2005 | Robert ....................... 310/322 |

OTHER PUBLICATIONS

French Search Report from French Patent Application No. 03/02817, filed Mar. 6, 2003.

* cited by examiner

*Primary Examiner*—Allan Olsen
(74) *Attorney, Agent, or Firm*—Lisa K. Jorgenson; James H. Morris; Wolf, Greenfield & Sacks, P.C.

(57) ABSTRACT

A process for manufacturing a resonator including the steps of: forming on an insulating substrate a first portion of a conductive material and a second portion of another material on the first portion; forming an insulating layer having its upper surface flush with the upper part of the second portion; forming by a succession of depositions and etchings a beam of a conductive material above the second portion, the beam ends being on the insulating layer on either side of the second portion, the upper surface of the second portion being exposed on either side of the beam, a third portion of a piezoelectric material on the beam and a fourth portion of a conductive material on the third portion above the beam portion located above the second portion; and removing the second portion.

12 Claims, 3 Drawing Sheets

METHOD FOR FORMING A TUNABLE PIEZOELECTRIC MICRORESONATOR

BACKGROUND OF THE INVENTION

1. Field of the Invention

The present invention relates to the field of piezoelectric microresonators.

2. Discussion of the Related Art

A piezoelectric microresonator conventionally comprises a piezoelectric layer sandwiched between two conductive electrodes. Such a microresonator is likely to start resonating when the signal applied between its electrodes is at a determined frequency.

The resonance frequency of a microresonator is set upon its manufacturing especially by the thickness and the nature of the piezoelectric layer. However, for many circuits such as settable analog filters, it is desirable to be able to vary the resonance frequency of microresonators.

SUMMARY OF THE INVENTION

An object of the present invention is to provide a method for manufacturing a tunable microresonator such as that described hereabove.

Another object of the present invention is to provide such a method comprising a reduced number of steps.

Another object of the present invention is to provide a tunable microresonator structure having electrodes easily connectable to an external connection pad or to the interconnect network of an integrated circuit.

To achieve these objects, the present invention provides a process for manufacturing a resonator comprising the steps of: forming on an insulating substrate a first portion of a conductive material and a second portion of another material on the first portion, the second portion being formed of a material selectively etchable with respect to the materials of the other elements formed during the process; forming an insulating layer having its upper surface flush with an upper part of the second portion; forming by a succession of depositions and etchings a beam of a conductive material running above the second portion, the beam ends being on the insulating layer on either side of the second portion, the upper surface of the second portion being exposed on either side of the beam, a third portion of a piezoelectric material on the beam, and a fourth portion of a conductive material on the third portion above the beam portion located above the second portion; and removing the second portion.

According to an alternative implementation of the above-mentioned process, the process includes, during the step of forming the first portion of conductive material, forming a fifth portion of the same conductive material as the first portion on the insulating substrate and continuing the first portion, the insulating layer formed at the next step covering the fifth portion.

According to an alternative implementation of the above-mentioned process, the forming of the first portion and of the second portion comprises the steps of: depositing a layer of a conductive material on a substrate; depositing on the conductive material layer a layer of a material selectively etchable with respect to the materials of the other elements formed during the process; and etching the two layers to form the second portion superposed to the first portion.

According to an alternative implementation of the above-mentioned process, the forming of the first portion and of the second portion comprises the steps of: depositing a first layer of a conductive material on a substrate; etching the first conductive material layer to form the first portion; depositing on the second portion and on the substrate a second layer of a material selectively etchable with respect to the materials of the other elements formed during the process; and etching the second layer to form the second portion on the first portion.

According to an alternative implementation of the above-mentioned process, the step of forming the beam, the third portion, and the fourth portion comprises the steps of: covering the insulating layer and the second portion with a first layer of a conductive material; etching the first layer to form said beam transversely above the second portion; depositing a layer of a piezoelectric material above a structure assembly comprising said beam, the second portion and the insulating layer; depositing a second layer of a conductive material above the piezoelectric material layer; and etching the piezoelectric material layer and the second layer to form the fourth portion of a conductive material superposed to the third portion of a piezoelectric material.

According to an alternative implementation of the above-mentioned process, the step of forming the beam, the third portion, and the fourth portion comprises the steps of: covering the insulating layer and the second portion with a first layer of a conductive material; depositing a layer of a piezoelectric material above the first layer; depositing a second layer of a conductive material above the piezoelectric material layer; etching the second layer to form the fourth portion of a conductive material; and etching the piezoelectric material layer and the first layer to form the third piezoelectric material portion superposed to the beam of a conductive material.

In an embodiment of the above-mentioned process, the insulating substrate corresponds to the insulating layer of an integrated circuit between penultimate and last interconnect levels, the first portion corresponding to a portion of the last interconnect level.

According to an alternative implementation of the above-mentioned process, the process includes, during the step of forming the beam, the third portion, and the fourth portion, forming an additional beam of a resistant material under said beam.

The present invention also provides a device comprising a microresonator formed of a piezoelectric layer between two conductive layers forming lower and upper electrodes of the microresonator, the microresonator being above a cavity formed in a substrate, the cavity bottom being covered with a conductive layer forming a setting electrode, the setting electrode extending in a conductive portion buried in the substrate, in a plane of the setting electrode.

In an embodiment of the above-mentioned device, the substrate is formed of an insulating layer covering a support layer, the cavity being formed across the entire thickness of the insulating layer, the setting electrode and the buried conductive portion being laid on the support layer.

BRIEF DESCRIPTION OF THE DRAWINGS

The foregoing and other objects, features, and advantages of the present invention will be discussed in detail in the following non-limiting description of specific embodiments in connection with the accompanying drawings.

DETAILED DESCRIPTION

As usual in the representation of microcomponents, the various drawings are not drawn to scale.

Figure 1:
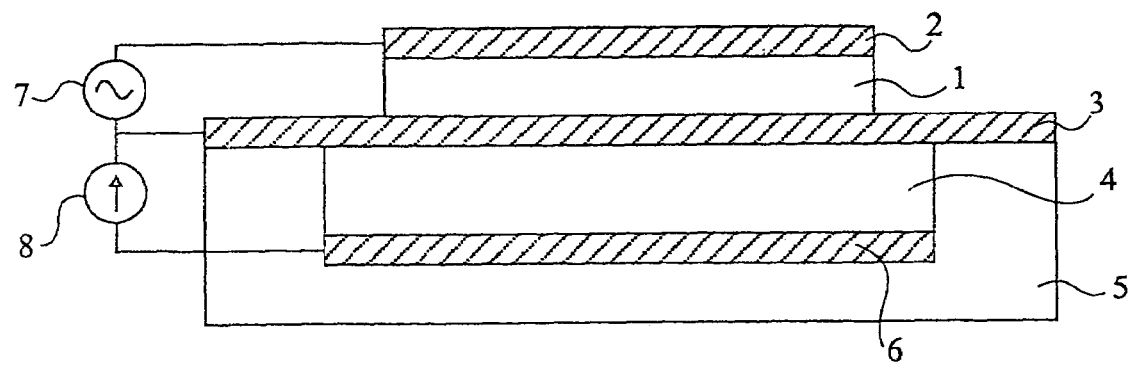
FIG. 1 is a simplified cross-section view of an example of a tunable microresonator formed according to an embodiment of the present invention.

FIG. 1 is a simplified cross-section view of a tunable microresonator formed according to an embodiment of the present invention. The microresonator is formed of a stacking of thin layers and comprises a piezoelectric layer 1 sandwiched between an upper electrode 2 and a lower electrode 3. Electrode 3 may be a thin conductive layer that forms a strip extending above a cavity 4 in an electrically-insulating substrate 5, the ends of the strip resting on the upper surface of substrate 5. The bottom of cavity 4 is covered with a metal layer forming a setting electrode 6.

Figure 2:
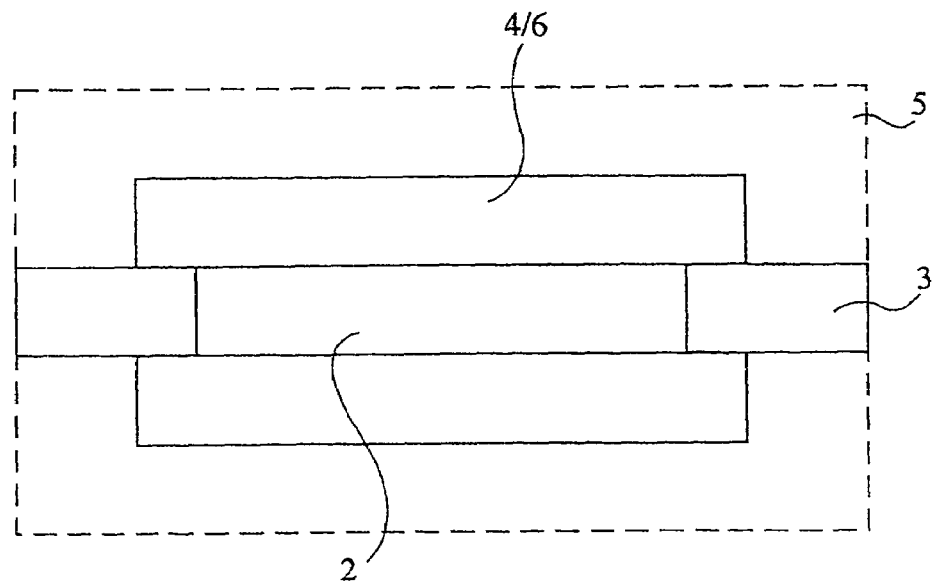
FIG. 2 is a top view of the microresonator of FIG. 1.

As illustrated in FIG. 2, in top view, the lateral edges of the strip forming lower electrode 3 are spaced apart from the edges of cavity 4. The width of upper electrode 2 is in this example equal to the width of lower electrode 3.

Electrodes 2 and 3 of the microresonator are connected to components of an electric circuit. When the microresonator is excited by means of an A.C. voltage 7 at a frequency equal to a resonance frequency of the microresonator, an electromechanical transduction phenomenon of the power between electrode 2 and piezoelectric film 1 and, conversely, a restitution of the mechanical power of piezoelectric film 1 in electric form on electrode 3, can be observed. When a D.C. voltage 8 is applied between setting electrode 6 and lower electrode 3 of the microresonator, a constraint is exerted on lower electrode 3. As a result, the resonance frequency of the microresonator varies. This variation is a function of the value of D.C. voltage 8.

According to an alternative embodiment of a microresonator according to the present invention, a support membrane is placed between the lower electrode and the cavity. Like the lower electrode, the support membrane is a strip extending above the cavity. The support membrane may for example be made of nitride.

The present invention aims at a process for manufacturing a microresonator such as described hereabove in relation with FIG. 1. The process comprises 4 successive steps which will be detailed hereafter.

Figure 3:
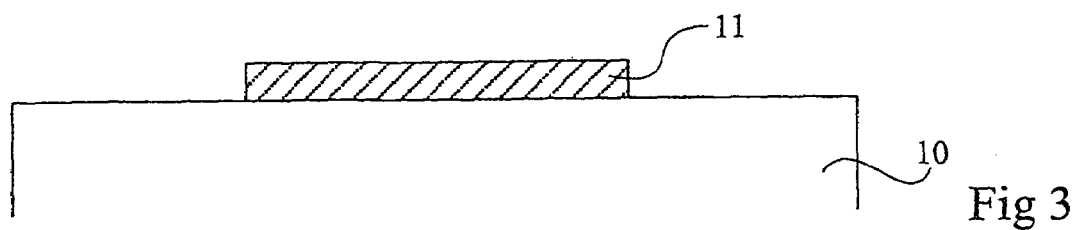
FIGS. 3 to 11 are cross-sectional views of the structures obtained after successive steps of the process according to an embodiment of the present invention.
Figure 4:
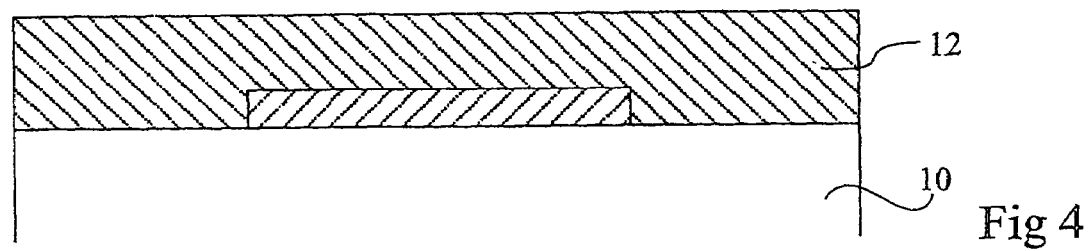
Figure 5:
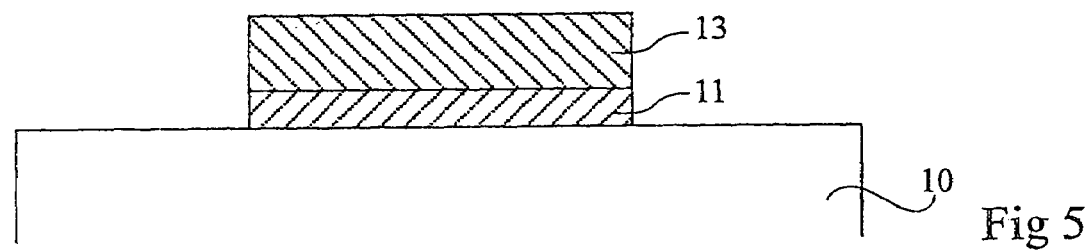

In a first phase illustrated in FIGS. 3 to 5, a conductive portion and a resin portion laid on the conductive portion are formed on an insulating layer.

In a first step, illustrated in FIG. 3, a portion 11 of a conductive material, conventionally copper or aluminum, is formed on an insulating portion 10. Conductive portion 11 will form the microresonator setting electrode.

At the next step, illustrated in FIG. 4, the entire structure comprising conductive portion 11 and insulating layer 10 is covered with a resin layer 12. A polymer resin of a type currently used in an integrated circuit forming process may for example be used in steps comprising the forming of a mask by photolithography. The deposition is performed so that the upper surface of the resin is flat, preferably after annealing.

In a next step, illustrated in FIG. 5, resin layer 12 is etched to obtain a resin portion 13 laid on conductive portion 11. In the case where resin layer 12 is photosensitive, for example, "positive", it may be provided to insolate the portions which are desired to be kept and to then conventionally remove the non-insolated portions. Resin portion 13 may be smaller or larger than conductive portion 11.

Generally, a portion of any material likely to be selectively etched or removed with respect to the other materials constitutive of the various elements formed during the process of the present invention may be formed on conductive portion 11.

The embodiment of the first phase illustrated in FIGS. 3 to 5 is particularly well adapted to the case where a microresonator is desired to be included in an integrated circuit. Insulating layer 10 will correspond in this case to the insulating layer placed between the penultimate and the last metal interconnect level of the integrated circuit. Conductive portion 11 may be a portion of the last interconnect level.

An alternative implementation of the first phase of the method according to the present invention starts from a substrate covered at its front surface with an insulating layer. A conductive layer is deposited on the insulating layer of the substrate, after which a resin layer is deposited on the conductive layer. The resin layer and the conductive layer are then successively etched to obtain a resin portion laid on a conductive portion. The same mask may be used to etch the two layers. Two superposed portions having the same shape in top view is then obtained. This alternative implementation of the first phase particularly applies to the forming of a microresonator as a discrete component, where conductive portion 11 is not a portion of a layer, other portions of which are used for other purposes.

Figure 6:
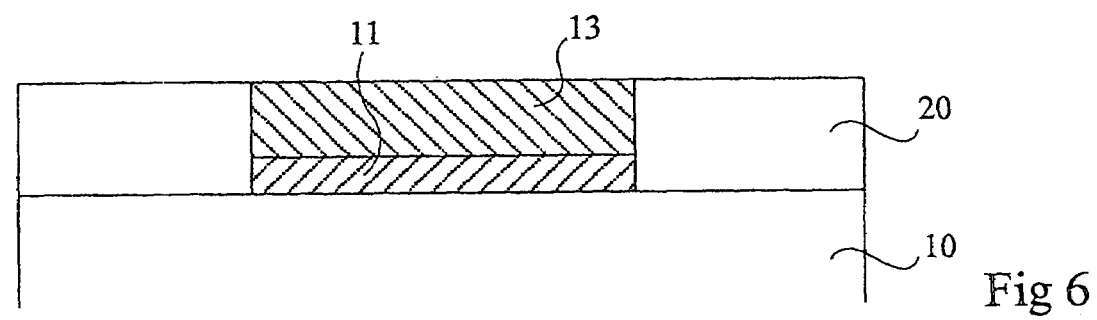

In a second phase of the process of the present invention, as illustrated in FIG. 6, an insulating layer 20 is deposited over the entire structure formed of portions 11, 13, and of insulating layer 10. The thickness of deposited insulating layer 20 is at least equal to the cumulated thickness of portions 11 and 13. Insulating layer 20 is for example a silicon oxide layer. A chem.-mech polishing of insulating layer 20 is then carried out until the upper part of resin portion 13 is exposed.

In a third phase of the process of the present invention, illustrated in FIGS. 7 to 10, a microresonator comprising a piezoelectric layer sandwiched between a lower electrode and an upper electrode is formed.

Figure 7:
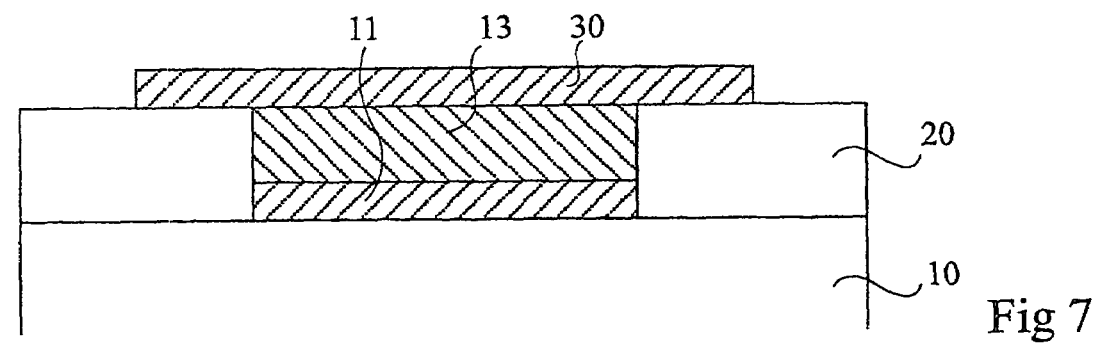

In a first step, illustrated in FIG. 7, a conductive layer is deposited on the previously-obtained structure shown in FIG. 6. The entire structure comprising insulating layer 20 and resin portion 13 is thus covered with a conductive layer that may be formed of one or several superposed layers that may for example be made of platinum, gold, aluminum, molybdenum, or tungsten. This conductive layer may be coated with an upper layer used as a bonding layer for the next step. The upper layer may for example be formed of titanium/aluminum or titanium/platinum.

The conductive layer is then etched to obtain a beam 30 above resin portion 13, the ends of beam 30 resting on insulating layer 20 on either side of resin portion 13. The beam shape in top view, not shown, is provided such that portions of resin portion 13 are exposed on either side of beam 30.

Figure 8:
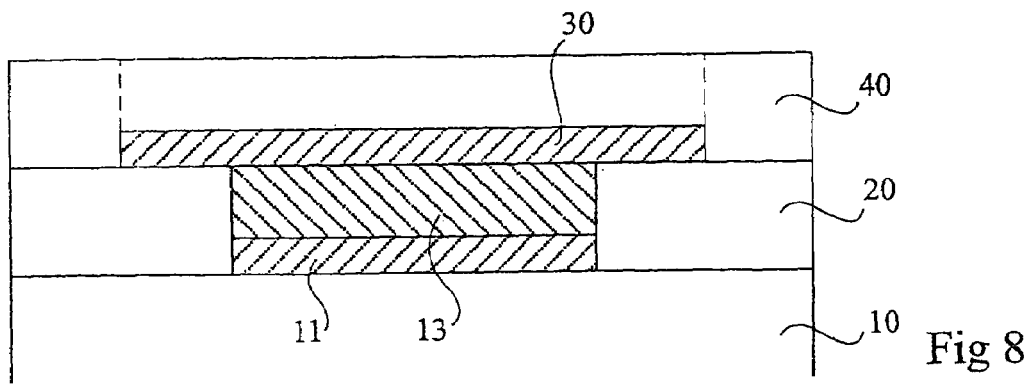

In a next step, illustrated in FIG. 8, a layer 40 of a material, for example, aluminum nitride, exhibiting piezoelectric characteristics at least for the layer portions deposited above beam 30, is deposited. The portions of the aluminum nitride layer formed above beam 30 exhibit polycrystalline characteristics. Those formed above insulating layer 20 are amorphous. Other suitable materials which may be used to form layer 40 include zinc oxide ZnO, "PZT" ($PbZrTiO_3$), or $KNbO_3$.

Figure 9:
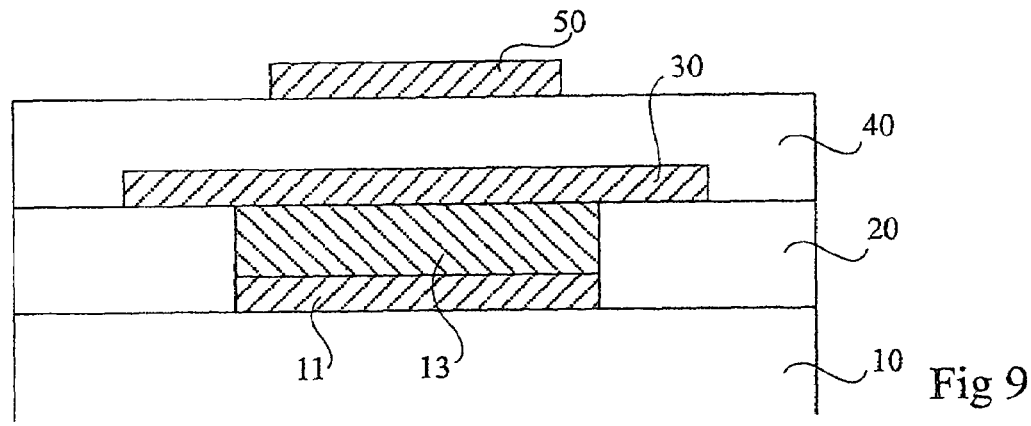

At the next step, illustrated in FIG. 9, one or several conductive layers, for example, made of aluminum, platinum, gold, or chromium-alloyed gold, are deposited. The conductive layer is then etched to form a conductive portion 50 positioned above beam 30 and resin portion 13. The width of conductive portion 50, perpendicularly to the cross-section plane of FIG. 9, is at most equal to that of beam 30. Preferably, and to limit interference in the microresonator, conductive portion 50 is shorter than the portion of beam 30 located above resin portion 13.

Figure 10:
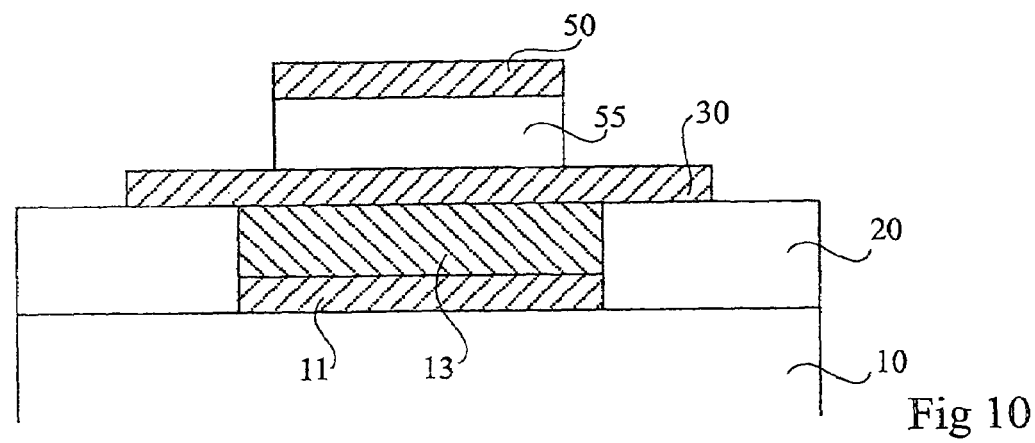

At the next step, illustrated in FIG. 10, layer 40 is etched to expose the parts of resin portion 13 located in top view on either side of beam 30. For this purpose, the same etch mask as that used to form conductive portion 50 may be used to obtain a piezoelectric portion 55 of same shape as conductive portion 50.

Thus, in the third phase of the process of the present invention, a microresonator comprising a piezoelectric layer 55 sandwiched between a lower electrode, i.e. beam 30, and an upper electrode, i.e. portion 50, has been formed.

According to an alternative implementation of the third phase of the process of the present invention, a conductive layer, a piezoelectric layer, and a conductive layer are deposited above the structure illustrated in FIG. 6. The upper conductive layer is then etched to form the upper electrode, the piezoelectric layer is etched, after which the lower conductive layer is etched to form the lower electrode. In this embodiment, the upper conductive layer and the piezoelectric layer may for example be etched by using a first mask, and the second lower conductive layer may be etched by using a second mask.

Figure 11:
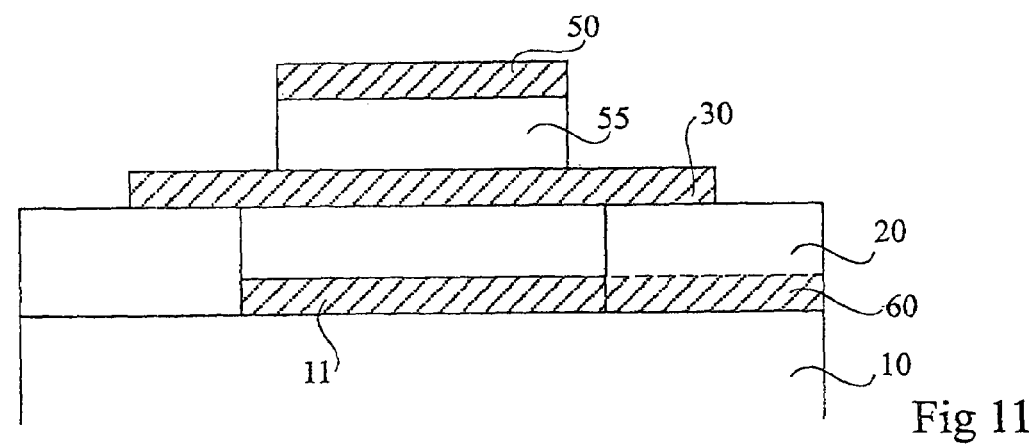

In a fourth and last phase of the process of the present invention, illustrated in FIG. 11, resin portion 13 is completely removed, including under the beam. The method of removal of resin portion 13, for example, by etching, must be selective with respect to all the materials used in the preceding steps.

In an alternative of the process of the present invention, an insulating support membrane may be formed under the lower microresonator electrode. For this purpose, the third phase of the process comprises an additional preliminary step consisting of forming a layer of a resistant material on resin portion 13 and on insulating layer 20. This layer may for example be formed of an oxide layer and of a nitride layer. This layer is then etched immediately after forming of beam 30 according to the same etch mask.

As a non-limiting example, the dimensions of the different elements of the microresonator obtained according to the process of the present invention are the following:

thickness of the setting electrode: 0.5 µm
spacing between the setting electrode and the lower electrode (thickness of resin portion 13): from 1 to 2 µm
thickness of the lower electrode: 0.1 µm
thickness of the piezoelectric layer: 2 µm
thickness of the upper electrode: 0.1 µm To form connections to the three electrodes of the device thus formed, additional steps may be provided in the process of the present invention.

In the case where the microresonator is part of an integrated circuit, the setting electrode may be formed on an interconnect level of the integrated circuit. The setting electrode (portion 11) may thus be connected to the integrated circuit elements via the interconnect network of the integrated circuit. The lower microresonator electrode (beam 30) may be connected to the interconnect network by forming a conductive via in insulating layer 20. The upper microresonator electrode (portion 50) may be connected to the interconnect network by extending conductive portion 50 by a strip placed above layers 20 and 40. Before depositing the conductive layer to form the upper electrode, an opening may for example be formed in piezoelectric layer 40, which will be covered with an insulator and which will be then filled with a conductive material. The conductive via thus formed will be placed above another via previously formed in insulating layer 20.

In the case where the microresonator is a discrete component, two contacts may be formed at the rear surface of substrate 10 by forming connection pads crossing the substrate to the setting electrode and the lower electrode. A front surface contact may be formed to have access to the upper electrode.

An advantage of the method of the present invention is that it is possible in the first phase of the process of the present invention to form in a same conductive layer a conductive portion intended to form setting electrode 11 and an extension 60 of this conductive portion, such as shown in dotted lines in FIG. 11. Extension 60 is intended to form a connection between the setting electrode and another element of the structure. Resin portion 13 formed in the next step only rests on setting electrode 11. Extension 60 is then totally covered with insulating layer 20 during the last step of the first phase of the process. In the case where the microresonator is a discrete component, such a connection may for example be connected to a connection pad at the rear surface. In the case where the microresonator is formed above an integrated circuit, such a connection may be connected to an element of the integrated circuit.

Comparing the device obtained by the process according to the present invention illustrated in FIG. 11 with the device illustrated in FIG. 1, it should be noted that the device according to the present invention differs by the presence of extension 60 of layer 11. This feature of the device is an aspect of the present invention.

Of course, the present invention is likely to have various alterations, modifications, and improvements which will readily occur to those skilled in the art. Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A process for manufacturing a resonator comprising the successive steps of:

forming on an insulating substrate a first portion of a conductive material and a second portion of another material on the first portion, the second portion being formed of a material selectively etchable with respect to the materials of other elements formed during the process;

forming an insulating layer having its upper surface flush with an upper part of the second portion;

forming by a succession of depositions and etchings a beam of a conductive material above the second portion, beam ends being on the insulating layer on either side of the second portion, the upper surface of the second portion being exposed on either side of the beam, a third portion of a piezoelectric material on the beam and a fourth portion of a conductive material on the third portion above a beam portion located above the second portion; and removing the second portion.

2. The process of claim 1, comprising, during the step of forming the first portion of conductive material, forming of a fifth portion of the same conductive material as the first portion on the insulating substrate and continuing the first portion, the insulating layer formed at the next step covering the fifth portion.

3. The process of claim 1, wherein forming the first portion and the second portion comprises the steps of:
   depositing a layer of a conductive material on a substrate;
   depositing on the conductive material layer a layer of a material selectively etchable with respect to the materials of the other elements formed during the process; and
   etching the two layers to form the second portion superposed to the first portion.

4. The process of claim 1, wherein forming the first portion and the second portion comprises the steps of:
   depositing a first layer of a conductive material on a substrate;
   etching the first conductive material layer to form the first portion;
   depositing on the first portion and on the substrate a second layer of a material selectively etchable with respect to the materials of the other elements formed during the process; and
   etching the second layer to form the second portion on the first portion.

5. The process of claim 1, wherein the step of forming the beam, the third portion, and the fourth portion comprises the steps of:
   covering the insulating layer and the second portion with a first layer of a conductive material;
   etching the first layer to form said beam transversely above the second portion;
   depositing a layer of a piezoelectric material above a structure assembly comprising said beam, the second portion and the insulating layer;
   depositing a second layer of a conductive material above the piezoelectric material layer; and
   etching the piezoelectric material layer and the second layer to form the fourth portion of a conductive material superposed to the third portion of a piezoelectric material.

6. The process of claim 1, wherein the step of forming the beam, the third portion, and the fourth portion comprises the steps of:
   covering the insulating layer and the second portion with a first layer of a conductive material;
   depositing a layer of a piezoelectric material above the first layer;
   depositing a second layer of a conductive material above the piezoelectric material layer;
   etching the second layer to form the fourth portion of a conductive material; and
   etching the piezoelectric material layer and the first layer to form the third piezoelectric material portion superposed to the beam of a conductive material.

7. The process of claim 1, wherein said insulating substrate corresponds to the insulating layer of an integrated circuit between penultimate and last interconnect levels, said first portion corresponding to a portion of the last interconnect level.

8. The process of claim 1, comprising, during the step of forming the beam, the third portion and the fourth portion, forming an additional beam of a resistant material under said beam.

9. A process for manufacturing resonator, comprising, in the order listed:
   depositing a first layer of a conductive material on an insulating substrate to form a first portion;
   depositing on the first layer a second layer of a material that is selectively etchable with respect to materials of other elements formed during the process;
   etching the first and second layers to form a second portion superimposed to the first portion;
   forming an insulating layer having its upper surface flush with an upper part of the second portion;
   forming by a succession of depositions and etchings of a beam of a conductive material above the second portion, beam ends being on the insulating layer on either side of the second portion, the upper surface of the second portion being exposed on either side of the beam, a third portion of a piezoelectric material on the beam and a fourth portion of a conductive material on the third portion above a beam portion located above the second portion; and
   removing the second portion.

10. The process of claim 9, comprising, during the step of forming the first portion of conductive material, forming a fifth portion of the same conductive material as the first portion on the insulating substrate and continuing the first portion, the insulating layer covering the fifth portion.

11. A process for manufacturing a resonator, comprising, in the order listed:
   depositing a first layer of a conductive material on an insulating substrate;
   etching the first layer to form the first portion;
   depositing on the first portion and on the substrate a second layer of material that is selectively etchable with respect to materials of other elements formed during the process;
   etching the second layer to form a second portion on the first portion;
   forming an insulating layer having its upper surface flush with an upper part of the second portion;
   forming by a succession of depositions and etchings a beam of a conductive material above the second portion, beam ends being on the insulating layer on either side of the second portion, the upper surface of the second portion being exposed on either side of the beam, a third portion of a piezoelectric material on the beam and a fourth portion of a conductive material on the third portion above a beam portion located above the second portion; and
   removing the second portion.

12. The process of claim 11, comprising, during the step of forming the first portion of conductive material, forming a fifth portion of the same conductive material as the first portion on the insulating substrate and continuing the first portion, the insulating layer covering the fifth portion.

* * * * *